United States Patent
Wilk et al.

(10) Patent No.: US 6,844,704 B2
(45) Date of Patent: Jan. 18, 2005

(54) VOLTAGE THRESHOLD DEVICE AND ENERGY STORAGE CELL FAILURE DETECTION SYSTEM FOR POWER SUPPLY

(75) Inventors: Michael David Wilk, Temecula, CA (US); Brian D. Moran, San Diego, CA (US)

(73) Assignee: ISE Corp., San Diego, CA (US)

( * ) Notice: Subject to any disclaimer, the term of this patent is extended or adjusted under 35 U.S.C. 154(b) by 83 days.

(21) Appl. No.: 09/972,073

(22) Filed: Oct. 4, 2001

(65) Prior Publication Data

US 2003/0067281 A1 Apr. 10, 2003

(51) Int. Cl.[7] .............................................. H02J 7/00
(52) U.S. Cl. ...................................................... 320/132
(58) Field of Search ................................. 320/132, 104, 320/103, 137, 166, 162; 363/155, 131, 132; 324/427; 307/10.1, 150

(56) References Cited

U.S. PATENT DOCUMENTS

| | | | |
|---|---|---|---|
| 4,668,906 A | 5/1987 | Ekstrand ..................... 323/297 |
| 5,072,171 A | 12/1991 | Eng ........................... 323/283 |
| 5,337,075 A | * 8/1994 | Takahashi et al. .......... 347/239 |
| 5,359,273 A | 10/1994 | Flückiger .................... 318/794 |
| 5,443,390 A | * 8/1995 | Kokkosoulis et al. ...... 439/76.1 |
| 5,710,699 A | 1/1998 | King et al. ................. 363/132 |
| 5,723,956 A | 3/1998 | King et al. ................. 318/139 |
| 6,058,998 A | 5/2000 | Kristen ........................ 156/359 |
| 6,201,686 B1 | 3/2001 | Hiratsuka et al. ........... 361/502 |
| 6,265,851 B1 | * 7/2001 | Brien et al. ................. 320/137 |
| 6,426,606 B1 | * 7/2002 | Purkey ........................ 320/166 |
| 6,489,753 B1 | * 12/2002 | Patterson .................... 320/162 |

OTHER PUBLICATIONS

"Man Bus Uses Double Layer Capacitors," *Hybrid Vehicles*, Feb. 2002, p. 3.

* cited by examiner

*Primary Examiner*—Pia Tibbits
(74) *Attorney, Agent, or Firm*—Stephen C. Beuerle; Procopio, Cory, Hargreaves & Savitch, LLP

(57) ABSTRACT

An active voltage limiting and failure detection system for an energy storage cell of a multiple energy storage cell pack includes a first electrical circuit and a second electrical circuit connected to the energy storage cell. The first electrical circuit is powered by the energy storage cell and includes means for drawing a significant amount of power from the energy storage cell when a cell voltage Vcell reaches a maximum voltage Vmax to reduce the cell voltage Vcell, means for stopping the drawing of the significant amount of power to reduce the cell voltage Vcell when the cell voltage Vcell reaches a minimum voltage Vmin, and means for drawing no power when the cell voltage Vcell reaches a shutdown voltage Vshutdown. The second electrical circuit includes means for indicating a cell active condition when the cell voltage Vcell is above a threshold active voltage Vactive, and means for indicating a cell inactive condition when the cell voltage Vcell drops below the threshold active voltage Vactive.

6 Claims, 2 Drawing Sheets

VOLTAGE THRESHOLD DEVICE AND ENERGY STORAGE CELL FAILURE DETECTION SYSTEM FOR POWER SUPPLY

BACKGROUND OF THE INVENTION

1. Field of the Invention

The present invention relates, in general, to systems for actively monitoring and/or controlling energy cells in a multiple energy storage cell pack, and, in particular, to systems for actively monitoring and/or controlling multiple interconnected cells of individual capacitors in an ultracapacitor energy storage cell pack.

2. Related Art

An ultracapacitor energy storage cell pack includes multiple interconnected cells of individual capacitors that store an electrical charge. Manufacturing tolerances and variables of an ultracapacitor energy storage cell pack cause differing voltages across the individual cells within the pack during charging and discharging operation. Exceeding the maximum recommended voltage across an individual cell when charging can damage or shorten the life of that cell, which can degrade the performance of the entire pack. Maintaining a working voltage level on each individual cell that is uniform throughout the pack of cells minimizes the stress and prolongs the life of each cell, causing the ultracapacitor energy storage cell pack to have a longer storage life and useful life.

Prior methods to limit the voltage of individual cells have offered either no protection or completely drained the cells. For example, a passive method has been used to limit the voltage of individual cells. The passive method includes using a resistor between positive and negative terminals of the cell. A problem with this method is that it causes a constant energy drain of the cell and results in a complete discharge of the cell over a period of time. Another standard clamping method combines a resistor and a voltage reference diode across the positive and negative terminals of the cell. A problem with this method is that the maximum power dissipation of the diode prevents the proper amount of over-voltage protection.

The performance of an ultracapacitor energy storage cell pack degrades when an individual cell fails to hold a charge. It is cost effective to replace the failed cell rather than discard the whole pack. A prior method for detecting failed cells involved monitoring the whole pack for an out-of-tolerance condition and, if an out-of-tolerance condition exists, sequentially checking each individual cell to locate the failure. This method is undesirable because the time it takes to determine which cells failed in a pack is unpredictable and can be lengthy.

SUMMARY OF THE INVENTION

Accordingly, an aspect of the present invention involves a system to limit and equalize the voltage of energy storage cells of a multiple energy storage cell pack by turning an individual circuit for each cell on or off at pre-set limits to limit the cell voltage by drawing energy or not drawing energy from the cell. Controlling the energy draw may involve the following: 1) at a turn-on limit, the circuit maintains a set maximum voltage; and 2) at a turn-off limit, energy is no longer actively drawn from the cell, thus, allowing the cell to maintain a minimum voltage and a longer storage life. The system and method protects each cell, or parallel group, from damage due to exceeding a maximum voltage limit, and then maintains an equal voltage across each cell, or parallel group. This limiting and equalizing extends the storage life and the useful life of each cell, or parallel group, and, therefore, the entire pack. The individual circuit draws its power from the cell itself and is effectively isolated from the circuit of any other cell.

In another aspect of the invention, each individual cell is isolated and remotely interrogated independent of any other cell. The interrogation can be run continuously and the response displays the status of each individual cell. The display immediately shows a cell failure and location in a matrix network of cells within the pack. The failure detection interrogation and response uses an opto-isolator that effectively isolates the circuit from the circuit of any other cell.

An additional aspect of the invention involves an active voltage limiting and equalizing system for an energy storage cell of a multiple energy storage cell pack. The system includes an electrical circuit connected to the energy storage cell and powered by the energy storage cell. The electrical circuit is adapted to draw a significant amount of power from the energy storage cell when a cell voltage Vcell reaches a maximum voltage Vmax to reduce the cell voltage Vcell, to stop drawing the significant amount of power to reduce the cell voltage Vcell when the cell voltage Vcell reaches a minimum voltage Vmin, and to draw no power when the cell voltage Vcell reaches a shutdown voltage Vshutdown.

Another aspect of the invention involves an active voltage limiting and equalizing system for an energy storage cell of a multiple energy storage cell pack. The system includes an electrical circuit connected to the energy storage cell and powered by the energy storage cell. The electrical circuit includes means for drawing a significant amount of power from the energy storage cell when a cell voltage Vcell reaches a maximum voltage Vmax to reduce the cell voltage Vcell, means for stopping the drawing of the significant amount of power to reduce the cell voltage Vcell when the cell voltage Vcell reaches a minimum voltage Vmin, and means for stopping the drawings of any power when the cell voltage Vcell reaches a shutdown voltage Vshutdown.

A further aspect of the invention involves a failure detection system for an energy storage cell of a multiple energy storage cell pack. The system includes an electrical circuit connected to the energy storage cell, and adapted to indicate a cell active condition when a cell voltage Vcell is above a threshold active voltage Vactive, and to indicate a cell inactive condition when the cell voltage Vcell drops below the threshold active voltage Vactive.

An additional aspect of the invention involves a failure detection system for an energy storage cell of a multiple energy storage cell pack. The system includes an electrical circuit connected to the energy storage cell. The electrical circuit includes means for indicating a cell active condition when a cell voltage Vcell is above a threshold active voltage Vactive, and means for indicating a cell inactive condition when the cell voltage Vcell drops below the threshold active voltage Vactive.

A further aspect of the invention involves an active voltage limiting and failure detection system for an energy storage cell of a multiple energy storage cell pack. The system includes a first electrical circuit and a second electrical circuit connected to the energy storage cell. The first electrical circuit is powered by the energy storage cell and is adapted to draw a significant amount of power from the energy storage cell when a cell voltage Vcell reaches a maximum voltage Vmax to reduce the cell voltage Vcell, to stop drawing the significant amount of power to reduce the cell voltage Vcell when the cell voltage Vcell reaches a minimum voltage Vmin, and to draw no power when the cell voltage Vcell reaches a shutdown voltage Vshutdown. The second electrical circuit is adapted to indicate a cell active condition when the cell voltage Vcell is above a threshold active voltage Vactive, and to indicate a cell inactive condition when the cell voltage Vcell drops below the threshold active voltage Vactive.

A yet further aspect of the invention involves an active voltage limiting and failure detection system for an energy storage cell of a multiple energy storage cell pack. The system includes a first electrical circuit and a second electrical circuit connected to the energy storage cell. The first electrical circuit is powered by the energy storage cell and includes means for drawing a significant amount of power from the energy storage cell when a cell voltage Vcell-reaches a maximum voltage Vmax to reduce the cell voltage Vcell, means for stopping the drawing of the significant amount of power to reduce the cell voltage Vcell when the cell voltage Vcell reaches a minimum voltage Vmin, and means for drawing no power when the cell voltage Vcell reaches a shutdown voltage Vshutdown. The second electrical circuit includes means for indicating a cell active condition when the cell voltage Vcell is above a threshold active voltage Vactive, and means for indicating a cell inactive condition when the cell voltage Vcell drops below the threshold active voltage Vactive.

Further features and advantages of the invention, as well as the structure and operation of various embodiments of the invention, are described in detail below with reference to the accompanying drawings.

BRIEF DESCRIPTION OF THE DRAWINGS

The following drawings illustrate both the design and utility of preferred embodiments of the invention.

DETAILED DESCRIPTION OF THE PREFERRED EMBODIMENTS

Figure 1:
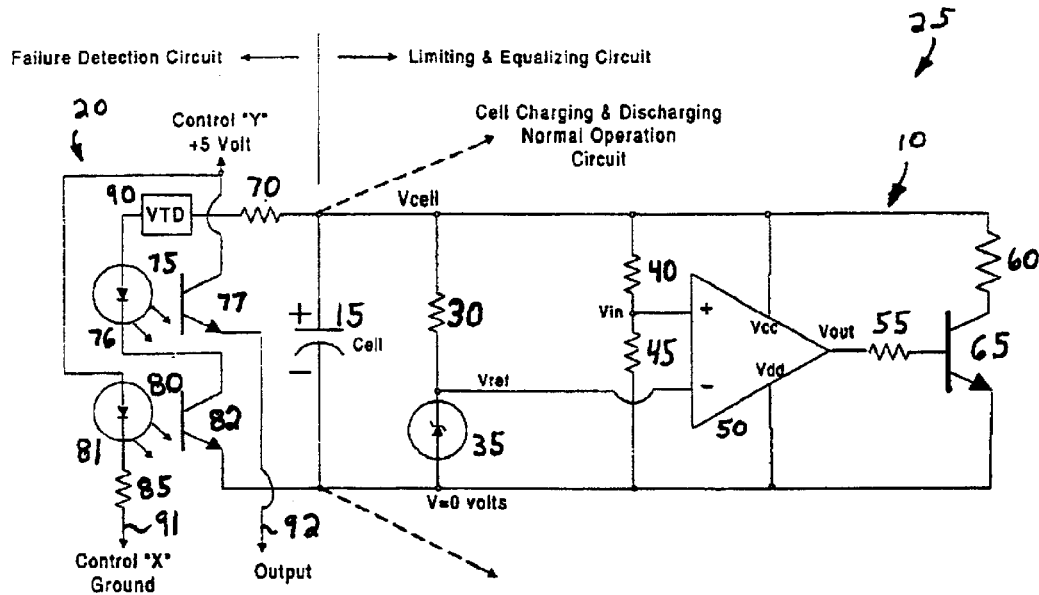
FIG. 1 is a schematic of an embodiment of a voltage limiting and equalizing circuit for an individual energy storage cell of a multiple energy storage cell pack and an embodiment of a failure detection circuit for the energy storage cell of the multiple energy storage cell pack.

With reference to FIG. 1, an embodiment of a voltage limiting and equalizing circuit 10 for an individual energy storage cell 15 and method of operation will first be described, followed by a description of an embodiment of a failure detection circuit 20 for the energy storage cell 15 and method of operation. Although the energy storage cell 15 will be described herein as a capacitor, the circuits 10, 20 may be used with other types of energy storage cells such as, but not by way of limitation, rechargeable fuel cells and rechargeable batteries. The energy storage cell 15 is preferably one of many energy storage cells 15 in a multiple energy storage cell pack. The voltage limiting and equalizing circuit 10 and/or the failure detection circuit 20 may be repeated "N" times for a N cell (e.g., 40 cell, 64 cell) multiple energy storage cell pack. Although the voltage limiting and equalizing circuit 10 and failure detection circuit 20 are shown as one integral electrical circuit 25, the circuits 10, 20 may be separate. The circuit 10 draws its power from the cell 15 itself and is effectively isolated from the circuit 10 of any other cell 15. For the purposes of this invention, cells 15 connected in parallel in a multiple energy storage cell pack may be effectively treated as a single cell 15.

The voltage limiting and equalizing circuit 10 may include the energy storage cell or capacitor 15, a first resistor 30, a zener diode 35, a second resistor 40, a third resistor 45, a low power high impedance operational amplifier 50, a fourth resistor 55, a fifth resistor 60, and a transistor 65. The cell voltage Vcell across the capacitor 15 increases as the capacitor 15 is charged. The low power high impedance operational amplifier 50 turns on when the cell voltage Vcell is sufficient to meet voltage requirements (Vcc-Vdd) to power the amplifier 50. The amplifier 50 then starts comparing an in voltage Vin to a reference voltage Vref.

Until the cell voltage Vcell exceeds the turn on voltage of the zener diode 35, no current flows through the resistor 30 and Vref equals the cell voltage Vcell. Because of the voltage divider function of the resistors 40, 45, Vin is always less than the cell voltage Vcell. Therefore, Vin is less than Vref, when the zener diode 35 is off, and an output voltage Vout of the amplifier 50 remains low during this time. As the cell voltage Vcell increases above the zener diode turn on voltage, current flows through the resistor 30, and Vref stays constant at a voltage equal to the voltage drop across zener diode 35. Vin increases proportionally with the cell voltage Vcell as determined by the values of resistors 40, 45.

When Vin exceeds Vref, the amplifier output voltage Vout goes high and turns on the output transistor 65 by providing current through the resistor 55. When the transistor 65 is turned on, the cell capacitor 15 is discharged through the resistor 60. If the resistor 60 and the transistor 65 are chosen to allow the current through the resistor 60 to exceed the available charge current to the cell capacitor 15, then the cell voltage Vcell is effectively limited or clamped at Vmax, the point where Vin equals Vref.

For the ultracapacitor application, the available charge current usually exceeds the shunting capacity of the resistor 60 and the transistor 65. Although the limiting circuit turns on and opposes any charge current that would cause an over-voltage on an individual cell 15, the maximum voltage Vmax for the cell 15 is exceeded when the charge current exceeds the limiting circuit discharge capability. The limiting circuit 10 still provides over-voltage protection at the higher voltages, however, by drawing current from the cell 15 at a rate proportional to the cell voltage Vcell divided by the value of the resistor 60. When the charging stops, the limiting circuit 10 brings the cell voltage Vcell back down to a value slightly less than Vmax.

In practice, the values of the resistors 40, 45 are chosen to set Vin at about 90% of the cell voltage Vcell. The values of the resistors 40, 45 are also chosen such that the constant current drain on the cell capacitor 15 is insignificant to the operation of the cell 15.

Figure 2:
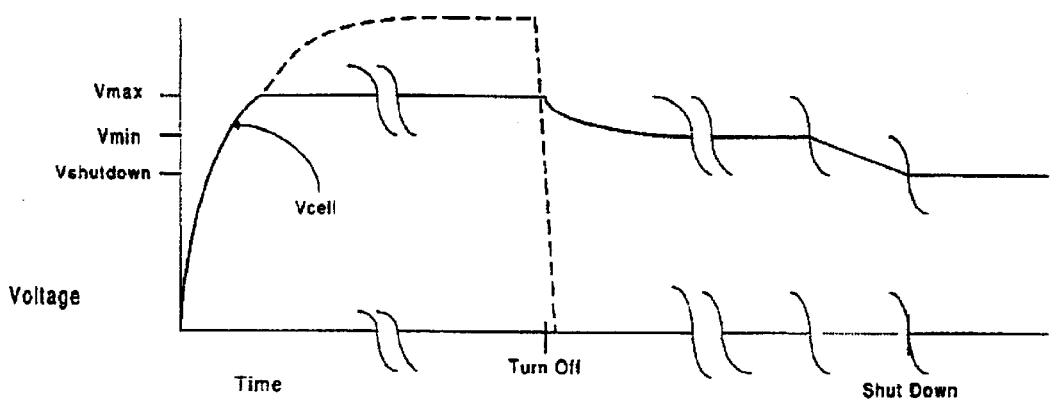
FIG. 2 is a graph of voltage versus time for an individual energy storage cell connected to the voltage limiting and equalizing circuit illustrated in FIG. 1.

FIG. 2 illustrates the voltage over time for the capacitor cell 15 when connected to the limiting circuit 10. When the cell voltage Vcell increases to a predetermined maximum value Vmax, the turn-on limit is reached and the limiting circuit 10 begins to draw a significant amount of power or current from the cell 15, thus, causing the cell voltage Vcell to decrease. For the ultra capacitor application, the available charge current can exceed the draw current and the cell voltage Vcell actually increases, although at a slower rate, until the charging current diminishes, as shown by the dotted line in FIG. 2. Once the limiting circuit 10 begins to draw current from the cell 15, it continues to draw current until the cell voltage Vcell drops to a minimum value Vmin, i.e., the zener diode 35 turns off, and Vout goes low turning off the transistor 65. Within the tolerances of the circuit components, each cell voltage Vcell is clamped to the same voltage Vmin, thus equalizing all the cells 15 within the entire pack.

At cell voltages less than the minimum voltage Vmin, the circuit 10 draws only a slight or insignificant amount of current from the cell 15 to monitor the cell voltage. This slight or insignificant current drain, mainly via the resistors 40, 45, causes the cell voltage Vcell to slowly decrease. Without any charging, the cell 15 continues to drop voltage until it reaches a shut down voltage Vshutdown, at which point the circuit 10 loses all power, shuts down, and removes any further discharge from the cell 15.

The values, Vmax, Vmin, and Vshutdown are constants that depend on the manufacturer's energy storage cell specification and the implementation of the limiting and equalization circuit 10.

Figure 3:
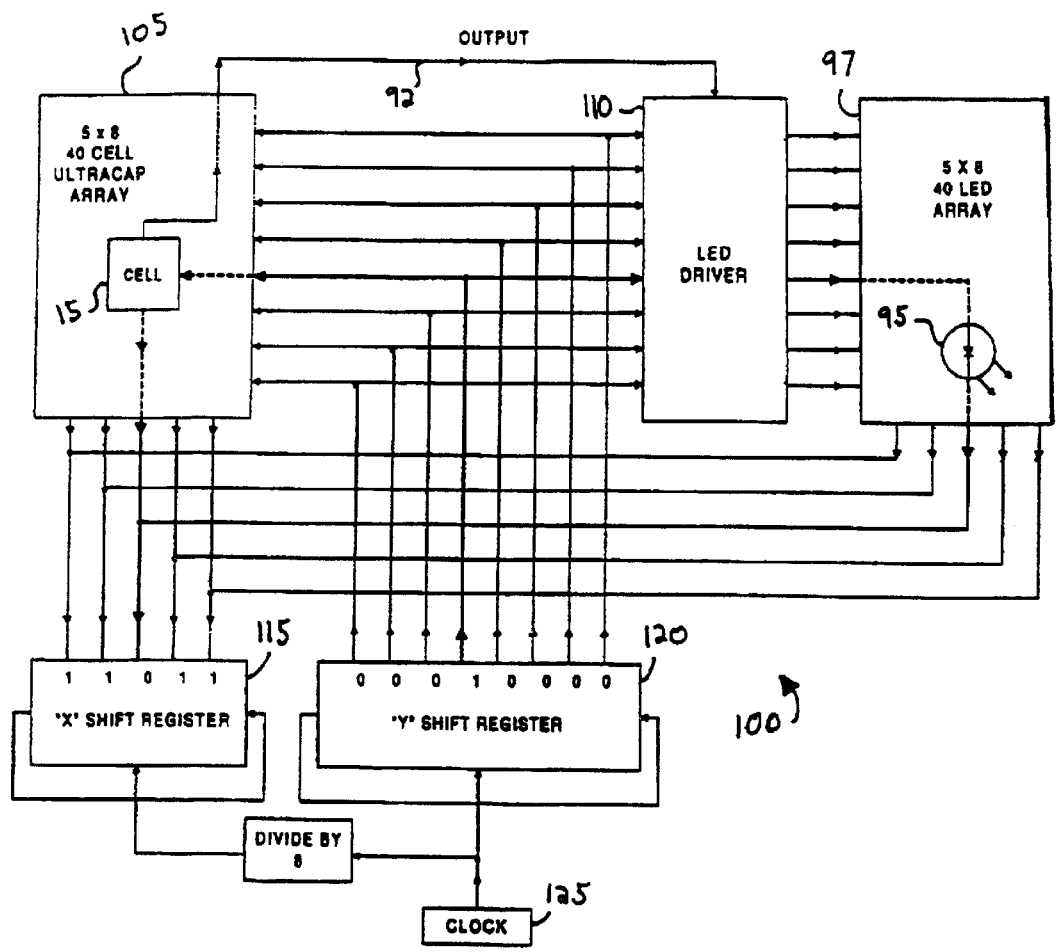
FIG. 3 is a block diagram of an embodiment of a failure detection interrogation and display system.

With reference back to FIG. 1, the failure detection circuit 20, which operates independently of the limiting and equalization circuit 10, and method of use will now be described. The failure detection circuit 20 includes a first resistor 70, a first opto-isolator 75 including a LED 76 and a photo-sensitive transistor 77, a second opto-isolator 80 including a LED 81 and a photo-sensitive transistor 82, a second resistor 85, a voltage threshold device (e.g., zener diode) 90, a ground line 91, and an output line 92. The first resistor 70 and the second resistor 85 function to limit the current for safe operation of the opto-isolators, 75, 80, respectively. The opto-isolators 75, 80 are circuits where the LED 76, 81 is connected to the input and an electrically isolated photo-sensitive transistor 77, 82 is connected to the output. When the LED 76, 81 turns on, light travels across a gap between the LED 76, 81 and the transistor 77, 82 where it is collected at the base of the transistor 77, 82, turning it on and generating an output. To select or "interrogate" the failure detection circuit 20, a 5-Volt control line goes "high" and the ground control line 91 goes "low". This "fires" the opto-isolater LED 76 and turns on the output transistor 77 to enable the energy storage cell voltage Vcell to "fire" the opto-isolator LED 81 and turn on the transistor 82 and connect the output line 92 to the "high" of the 5-Volt control line. As seen in FIG. 3 and explained below, this operation can result in lighting one LED 95 in a display LED array 97.

The voltage threshold device 90 (e.g., zener diode) sets a minimum threshold active voltage Vactive for the cell voltage Vcell to overcome before the second LED 81 can be "fired". For a Vcell value below the minimum threshold active voltage Vactive, the LED 81 will not "fire", the corresponding LED 95 in the display array 97 will not light and the cell 15 is defined to be in a "failed" or inactive condition.

With reference additionally to FIG. 3, an embodiment of a failure detection and display system 100 and method of use will now be described. The failure detection and display system 100 may include an LED array 97, an ultracapacitor cell array 105, a LED driver 110, a X shift register 115, a Y shift register 120, and a clock 125. The ultracapacitor cell array 105 and the LED display array 97 have the same X and Y selection address applied thereto.

If the cell 15 is "good" or active, an output enable signal turns on the LED driver 110 and the LED 95 is illuminated. The voltage of the cell 15 turns on the output line 92 in response to an interrogation, which may be run continuously. If the cell 15 has failed, the output line 92 will not go high and cause the LED 95 to light, thus, a dark LED 95 indicates the failed cell 15. The voltage threshold device 90 in series with the output line 92 can be chosen to set the threshold active voltage Vactive of the cell 15.

The address is generated by the X shift register 115 and the Y shift register 120. For the Y register 120, a "1" selects a line and for the X register 115 a "0" selects a line. The shift register design allows only one line to be selected at a time. The clock 125 causes the Y shift register 120 to be clocked eight times faster than the X shift register 115 to sequentially select all the cells 15 in a single column and then step to the next column and repeat the process to continuously scan the cell array 105.

Observing a LED 95 that does not illuminate indicates a "failed" or inactive cell 15. The actual LED array 97 is physically placed on a circuit board so that the LEDs 95 in the array 97 correspond to the physical layout locations of the cells 15, allowing the array 97 to serve as a diagnostic tool to automatically locate any one or more failed cells within the pack 105. Thus, the LED display indicates current status of all the cells 15 within the pack 105 and automatically identifies the location of any cells 15 that need to be replaced.

It should be noted, the failure detection and display system 100 may be repeated N times for N (e.g., 2, 3, 4) multiple energy storage cell packs.

Thus, the limiting and equalizing circuit 25 limits and equalizes the voltage of the cells by turning an individual circuit for each cell on or off at pre-set limits to limit the cell voltage by drawing energy or not drawing energy from the cell. The circuit 25 protects each cell, or parallel group, from damage due to exceeding a maximum voltage limit, and then maintains an equal voltage across each cell, or parallel group. This limiting and equalizing extends the storage life and the useful life of each cell, or parallel group, and, therefore, the entire pack.

The failure detection circuit 20 and failure detection system 100 isolates and remotely interrogates each individual cell 15 independent of any other cell 15 in the cell array 105. The status of each individual cell 15 and location is immediately displayed in the LED array 97 so that one can determine a corresponding cell failure and location in the cell array 105. By precisely identifying the location of any failed cells 15, any failed cells 15 can be quickly replaced without having to discard the entire pack or sequentially check each individual cell to locate a failure as was done in the past.

While embodiments and applications of this invention have been shown and described, it would be apparent to those in the field that many more modifications are possible without departing from the inventive concepts herein. The invention, therefore, is not to be restricted except in the spirit of the appended claims.

What is claimed is:

1. Am active voltage limiting and failure detection system for an energy storage cell of a multiple energy storage cell pack, the energy storage cell having a cell voltage Vcell, the system comprising: a first electrical circuit connected to and powered by the energy storage cell, the first electrical circuit drawing a significant amount of power from the energy storage cell when a cell voltage Vcell reaches a maximum voltage Vmax to reduce the cell voltage Vcell, to stop drawing the significant amount of power to reduce the cell voltage Vcell when the cell voltage Vcell reaches a minimum voltage Vmin, and to draw no power when the cell voltage Vcell reaches a shutdown voltage Vshutdown; and a second electrical circuit connected to the energy storage cell and indicating a cell active condition when the cell voltage Vcell is above a threshold active voltage Vactive, and to indicate a cell inactive condition when the cell voltage Vcell drops below the threshold active voltage Vactive.

2. An active voltage limiting and failure detection system for an energy storage cell of a multiple energy storage cell pack, the energy storage cell having a cell voltage Vcell, the system comprising: a first electrical circuit connected to and powered by the energy storage cell, the first electrical circuit includes means for drawing a significant amount of power from the energy storage cell when a cell voltage Vcell reaches a maximum voltage Vmax to reduce the cell voltage Vcell, means for stopping the drawing of the significant amount of power to reduce the cell voltage Vcell when the cell voltage Vcell reaches a minimum voltage Vmin, and means for drawing no power when the cell voltage Vcell reaches a shutdown voltage Vshutdown; and a second electrical circuit connected to the energy storage cell and including means for indicating a cell active condition when the cell voltage Vcell is above a threshold active voltage Vactive, and means for indicating a cell inactive condition when the cell voltage Vcell drops below the threshold active voltage Vactive.

3. An active voltage limiting and failure detection system for an energy storage cell of a multiple energy storage cell pack, the energy storage cell having a cell voltage Vcell, the system comprising: a first electrical circuit connected to and powered by the energy storage cell, the first electrical circuit includes means for drawing a significant amount of power from the energy storage cell when a cell voltage Vcell reaches a maximum voltage Vmax to reduce the cell voltage Vcell, and means for stopping the drawing of the significant amount of power to reduce the cell voltage Vcell when the cell voltage Vcell reaches a minimum voltage Vmin.

4. The active voltage limiting and failure detection system of claim 3, further including means for drawing no power when the cell voltage Vcell reaches a shutdown voltage Vshutdown.

5. The active voltage limiting and failure detection system of claim 3, further including a second electrical circuit connected to the energy storage cell, and indicating a cell active condition when a cell voltage Vcell is above a threshold active voltage Vactive, and indicating a cell inactive condition when the cell voltage Vcell drops below the threshold active voltage Vactive and the circuit including a voltage threshold device to set the threshold active voltage Vactive.

6. The system of claim 5, wherein the voltage threshold device is a zener diode.

* * * * *